United States Patent
Yamazaki et al.

(10) Patent No.: US 8,361,222 B2
(45) Date of Patent: Jan. 29, 2013

(54) METHOD FOR PRODUCING GROUP III NITRIDE-BASED COMPOUND SEMICONDUCTOR

(75) Inventors: Shiro Yamazaki, Aichi-ken (JP); Seiji Nagai, Aichi-ken (JP); Takayuki Sato, Aichi-ken (JP); Katsuhiro Imai, Aichi-Pref. (JP); Makoto Iwai, Aichi-Pref. (JP); Takatomo Sasaki, Osaka (JP); Yusuke Mori, Osaka (JP); Fumio Kawamura, Osaka (JP)

(73) Assignees: Toyoda Gosei Co., Ltd., Nishikasugai-Gun, Aichi-Ken (JP); NGK Insulators, Ltd., Nagoya, Aichi-Pref (JP)

( * ) Notice: Subject to any disclaimer, the term of this patent is extended or adjusted under 35 U.S.C. 154(b) by 1279 days.

(21) Appl. No.: 12/081,943

(22) Filed: Apr. 23, 2008

(65) Prior Publication Data
US 2008/0271665 A1    Nov. 6, 2008

(30) Foreign Application Priority Data

Apr. 24, 2007   (JP) .................................. 2007-114663
Feb. 20, 2008   (JP) .................................. 2008-038980

(51) Int. Cl.
*C30B 15/14*   (2006.01)
*C30B 15/00*   (2006.01)
*C30B 21/06*   (2006.01)
*C30B 27/02*   (2006.01)
*C30B 28/10*   (2006.01)
*C30B 30/04*   (2006.01)

(52) U.S. Cl. ................... 117/13; 117/3; 117/17; 117/19
(58) Field of Classification Search ................ 117/13, 117/3, 17, 19
See application file for complete search history.

(56) References Cited

U.S. PATENT DOCUMENTS 6,086,673 A *  7/2000  Molnar ............................ 117/90
7,755,172 B2  7/2010  Hashimoto et al.
(Continued)

FOREIGN PATENT DOCUMENTS

JP    9-30891 A    2/1997
JP    9-30891 (A)  2/1997
(Continued)

OTHER PUBLICATIONS

Japanese Office Action dated Sep. 6, 2011, with English translation.
(Continued)

*Primary Examiner* — James McDonough
(74) *Attorney, Agent, or Firm* — McGinn IP Law Group, PLLC

(57) ABSTRACT

In the production of GaN through the flux method, deposition of miscellaneous crystals on the nitrogen-face of a GaN self-standing substrate and waste of raw materials are prevented. Four arrangements of crucibles and a GaN self-standing substrate are exemplified. In FIG. 1A, a nitrogen-face of a self-standing substrate comes into close contact with a sloped flat inner wall of a crucible. In FIG. 1B, a nitrogen-face of a self-standing substrate comes into close contact with a horizontally facing flat inner wall of a crucible, and the substrate is fixed by means of a jig. In FIG. 1C, a jig is provided on a flat bottom of a crucible, and two GaN self-standing substrates are fixed by means of the jig so that the nitrogen-faces of the substrates come into close contact with each other. In FIG. 1D, a jig is provided on a flat bottom of a crucible, and a GaN self-standing substrate is fixed on the jig so that the nitrogen-face of the substrate is covered with the jig. A flux mixture of molten gallium and sodium is charged into each crucible, and a GaN single crystal is grown on a gallium-face under pressurized nitrogen.

11 Claims, 3 Drawing Sheets

U.S. PATENT DOCUMENTS

| | | |
|---|---|---|
| 7,833,347 B2 * | 11/2010 | Iwai et al. .................. 117/73 |
| 2005/0098090 A1 * | 5/2005 | Hirota et al. .................. 117/2 |
| 2008/0001165 A1 | 1/2008 | Hashimoto et al. |
| 2008/0223286 A1 * | 9/2008 | Nagai et al. .................. 117/88 |

FOREIGN PATENT DOCUMENTS

| | | |
|---|---|---|
| JP | 2005-154254 A | 6/2005 |
| JP | 2005-154254 (A) | 6/2005 |
| JP | 2005-175275 (A) | 6/2005 |
| JP | 2005-187317 | 7/2005 |
| JP | 2005-194146 | 7/2005 |
| JP | 2007-238343 A | 9/2007 |
| JP | 2007-238343 (A) | 9/2007 |
| JP | 2008-214126 (A) | 9/2008 |

OTHER PUBLICATIONS

Japanese Office Action dated Oct. 2, 2012 with partial English translation thereof.

* cited by examiner

Fig. 1.A
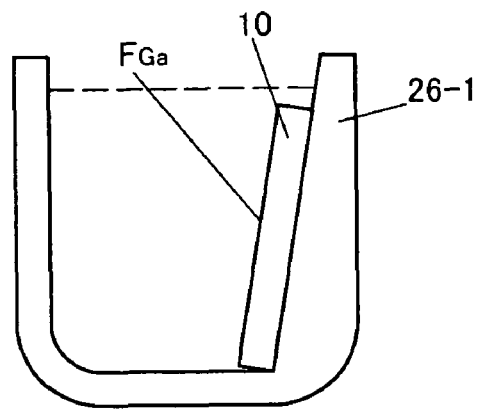
Fig. 1.B
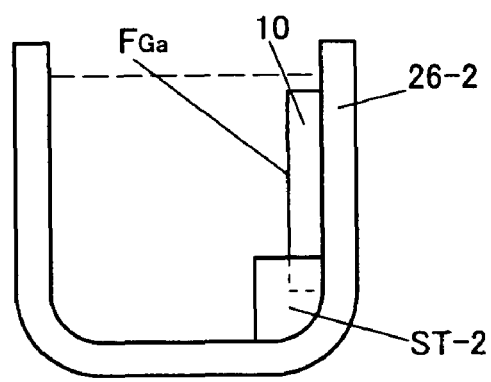
Fig. 1.C
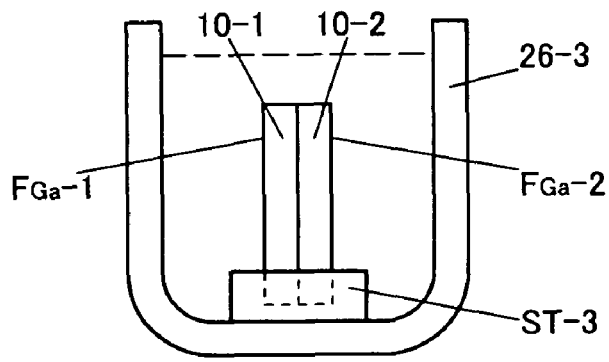
Fig. 1.D
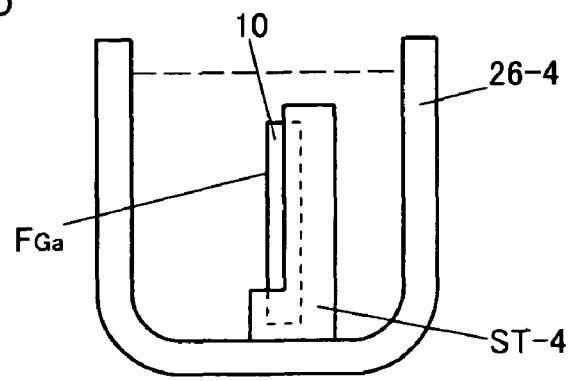

Fig. 3. A
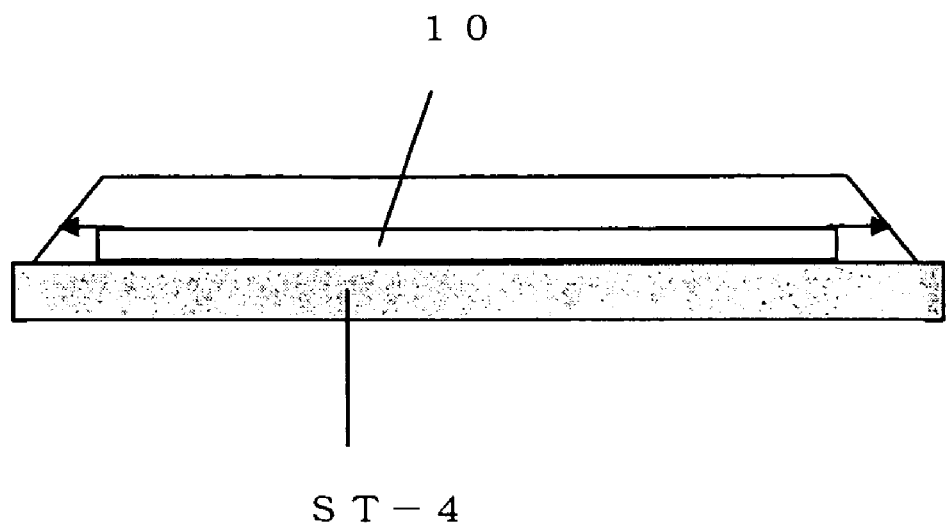
1 0
S T - 4
Fig. 3. B
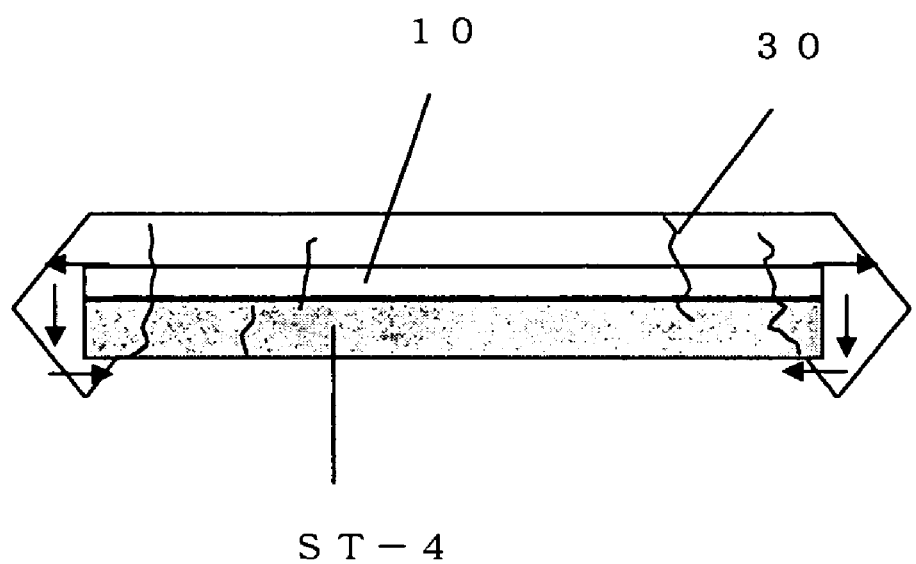
1 0      3 0
S T - 4

METHOD FOR PRODUCING GROUP III NITRIDE-BASED COMPOUND SEMICONDUCTOR

BACKGROUND OF THE INVENTION

1. Field of the Invention

The present invention relates to a method for producing a Group III nitride-based compound semiconductor through the flux process, in which nitrogen (N) is reacted with a Group III element of gallium (Ga), aluminum (Al), or indium (In) in a flux mixture containing an alkali metal, to thereby grow a Group III nitride-based compound semiconductor crystal. As used herein, "Group III nitride-based compound semiconductor" encompasses a semiconductor represented by the formula $Al_xGa_yIn_{1-x-y}N$ ($0 \leq x \leq 1$, $0 \leq y \leq 1$, $0 \leq x+y \leq 1$); such a semiconductor containing a predetermined element so as to attain, for example, an n-type/p-type conduction; and such a semiconductor in which the Group III element has been partially substituted by B or Tl, and the group V element has been partially substituted by P, As, Sb, or Bi.

2. Background Art

There have been developed techniques for precipitating gallium nitride (GaN) by exposing nitrogen or ammonia to a melt (flux mixture) of gallium (Ga) and sodium (Na) under pressurized conditions. In such a technique, when a seed crystal or a substrate is provided in such a flux mixture, gallium nitride (GaN) is deposited on a surface of the seed crystal or substrate. Thus, a gallium nitride (GaN) single crystal having a thickness of several millimeters can be produced.

Hitherto reported techniques employing a substrate provided in such a flux mixture include a technique in which a gallium nitride (GaN) single crystal is grown on a surface of a substrate made of a material different from a Group III nitride-based compound semiconductor (hereinafter the substrate may be referred to as a "hetero-substrate") (Japanese Patent Application Laid-Open (kokai) No. 2005-187317); and a technique in which a gallium nitride (GaN) film is epitaxially grown on a hetero-substrate to form a template, and a gallium nitride (GaN) single crystal is grown on the gallium nitride (GaN) film (Japanese Patent Application Laid-Open (kokai) No. 2005-194146). However, those techniques pose a problem in that when a GaN single crystal is grown on a hetero-substrate in the flux mixture at high temperature and high pressure, followed by cooling to room temperature, cracks are likely to be generated in the thus-grown single crystal, since the hetero-substrate has a lattice constant and expansion coefficient different from those of a Group III nitride-based compound semiconductor. In addition, in a technique employing a template formed by growing a gallium nitride (GaN) film or the like on a hetero-substrate, the temperature of the template is lowered from high epitaxial growth temperature to room temperature during formation thereof, and a GaN single crystal is grown on the template in the flux mixture at high temperature and high pressure, followed by cooling to room temperature. Therefore, cracks are more likely to be generated in the thus-grown single crystal. In consideration of such problems, it is desirable to use a self-standing substrate having the same composition as a Group III nitride-based compound semiconductor which is to be produced.

When a so-called GaN self-standing substrate having a c-plane main surface is employed as a seed crystal, crystals are deposited on both surfaces (i.e., gallium-face (Ga-face) of the front surface and nitrogen-face (N-face) of the back surface) of the substrate. Although a single crystal is grown on the Ga-face, three-dimensional crystal growth tends to occur on the N-face, and smooth crystal growth is difficult to attain on the N-face. Therefore, a GaN single crystal grown on the N-face exhibits poor quality, and thus is problematic when provided as a commercial product. In other words, the N-face is a surface which wastes a raw material.

SUMMARY OF THE INVENTION

In view of the foregoing, the present inventors have accomplished the present invention for the purposes of suppressing crystal growth on the nitrogen-face of a self-standing substrate made of Group III nitride-based compound semiconductor, and reducing waste of a raw material, which would otherwise be produced by crystal growth on the nitrogen-face, which substrate is employed for the production of a Group III nitride-based compound semiconductor single crystal through the flux process, so as to prevent generation of cracks in the resultant single crystal.

In a first aspect of the present invention, there is provided a method for producing a Group III nitride-based compound semiconductor crystal in which a Group III nitride-based compound semiconductor crystal is grown by reacting nitrogen (N) with a Group III element of gallium (Ga), aluminum (Al), or indium (In) in a flux mixture containing an alkali metal, which method comprises:

placing, in the flux mixture, a plate-form self-standing substrate made of Group III nitride-based compound semiconductor and having a +c-plane main surface, the substrate serving as a seed crystal, so that a line normal to the +c-plane of the seed crystal is maintained in a direction within ±30° with respect to a horizontal plane, and growing a semiconductor crystal on a Group III element-face of the seed crystal while the Group III element-face of the plate-form seed crystal is exposed to the flux mixture and a nitrogen-face of the seed crystal is substantially not exposed to the flux mixture. As is well known, one surface of the self-standing substrate for growing a Group III nitride-based compound semiconductor crystal is a Group III element-face, and the other surface of the substrate is a nitrogen-face. As used herein, the expression "the nitrogen-face is substantially not exposed to the flux mixture" refers to a situation where there is no convection or other movement of the flux mixture that would allow continuous crystal precipitation on the nitrogen-face, but does not necessarily refer to a situation where flow of the flux mixture to the nitrogen-face is completely blocked.

A second aspect of the present invention is drawn to a specific embodiment of the method according to the above aspect of the invention, wherein the plate-form seed crystal is placed so that the nitrogen-face thereof comes into close contact with a wall of a flux mixture container. As used herein, the expression "close contact" refers to a situation the nitrogen-face comes into contact with the container wall to such an extent that there is no convection or other movement of the flux mixture that would allow continuous crystal precipitation on the nitrogen-face, but does not necessarily refer to a situation where flow of the flux mixture to the nitrogen-face is completely blocked; for example, "adhesion" between the nitrogen-face and the container wall (the same shall apply hereinafter).

A third aspect of the present invention is drawn to a specific embodiment of the method according to the above aspect of the invention, wherein a pair of plate-form seed crystals is placed in the flux mixture container so that the nitrogen-faces of the seed crystals come into close contact with each other.

A fourth aspect of the present invention is drawn to a specific embodiment of the method according to the above aspect of the invention, wherein the nitrogen-face of the plate-form seed crystal is covered with a member made of a material other than a Group III nitride-based compound semiconductor, and then the seed crystal is placed in the flux mixture container. As used herein, the expression "covered" refers to a situation where the nitrogen-face comes into contact with the member to such an extent that there is no convection or other movement of the flux mixture that would allow continuous crystal precipitation on the nitrogen-face, but does not necessarily refer to a situation where the nitrogen-face is "coated" with the member so that flow of the flux mixture to the nitrogen-face is completely blocked. A fifth aspect of the present invention is drawn to a specific embodiment of the method according to the above aspect of the invention, wherein the member has a size greater than that of the plate-form seed crystal. A sixth aspect of the present invention is drawn to a specific embodiment of the method according to the above aspect of the invention, wherein the member has a surface on which a Group III nitride-based compound semiconductor crystal is not grown during exposure of the member to the flux mixture.

From the viewpoint of preventing generation of cracks in a single crystal grown through the flux process, it is preferred to employ a self-standing substrate made of Group III nitride-based compound semiconductor having the same composition as the single crystal. However, when, for example, a self-standing substrate made of Group III nitride-based compound semiconductor and having a +c-plane main surface is employed, a single crystal is grown on the Group III element-face of the substrate through the flux process, but three-dimensional crystal growth tends to occur on the nitrogen-face of the substrate, and smooth crystal growth is difficult to attain on the nitrogen-face. Thus, employment of means for shielding the nitrogen-face can reduce waste of a raw material. Such shielding means realizes an increase in amount of a single crystal which is grown, as well as effective use of a raw material. Preferably, a line normal to a crystal growth surface is aligned with generally a horizontal direction. When such an alignment exists, even if a Group III nitride-based compound semiconductor dissolved in a flux mixture becomes super-saturated, resulting in precipitation of miscellaneous crystals, the miscellaneous crystals are less likely to be deposited on a seed substrate on which a single crystal is grown. Based on the present inventors' finding, when the nitrogen-face of a plate-form seed crystal is covered with a member which is made of a material other than a Group III nitride-based compound semiconductor and which has a size greater than that of the seed crystal, a crystal grown on a side surface of the seed crystal can be prevented from reaching the nitrogen-face.

According to the present invention, since plate-form seed crystals are arranged in a crucible containing a flux mixture so that the crystal growth surfaces of the seed crystals are placed in a vertical direction or slanted, the seed crystals are highly effectively accommodated in the crucible. With this arrangement, since the flux mixture contained in the crucible flows along each of the crystal growth surfaces by means of thermal convection generated in the flux mixture, the flux mixture is sufficiently and uniformly distributed over each crystal growth surface.

Thus, according to the present invention, crystal growth rate can be increased, and the crystallinity and homogeneity of a grown semiconductor crystal can be effectively improved, as compared with a conventional case.

Therefore, according to the present invention, the quality, yield, and production efficiency of a semiconductor crystal can be considerably improved, as compared with a conventional case.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 1A to 1D are schematic cross-sectional views of four exemplified arrangements of flux mixture containers and a seed crystal employed in the present invention; i.e., arrangements of crucibles 26-1 to 26-4 and a Group III nitride-based compound semiconductor self-standing substrate (seed crystal) 10 having a c-plane main surface;

FIGS. 3A and 3B show crystals produced through production methods described in the Embodiments.

DETAILED DESCRIPTION OF PREFERRED EMBODIMENTS

Figure 2:
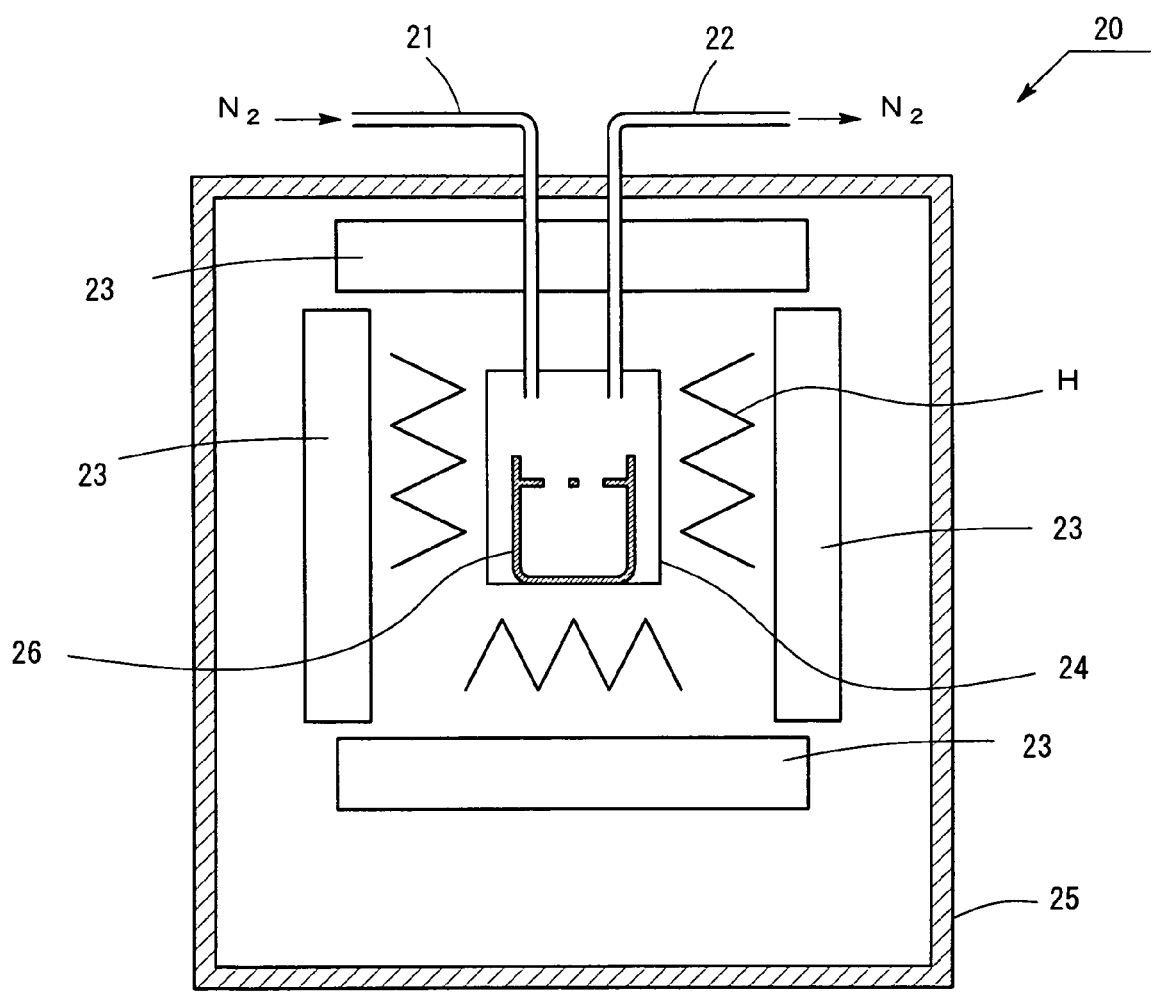
FIG. 2 shows the configuration of a crystal growth apparatus 20 employed in the Embodiments.

FIGS. 1A to 1D are schematic cross-sectional views of four specific examples of arrangement of flux mixture containers and a seed crystal employed in the present invention; i.e., arrangements of crucibles 26-1 to 26-4 and a Group III nitride-based compound semiconductor self-standing substrate (seed crystal) 10 having a c-plane main surface. For the sake of simplification, next will be described the case where the self-standing substrate (seed crystal) 10 is a GaN self-standing substrate having a c-plane main surface; a flux mixture of molten gallium and sodium is employed; and nitrogen gas is employed as a nitrogen source. However, the present invention can be applied to growth of a Group III nitride-based compound semiconductor crystal through the flux process, which employs a Group III nitride-based compound semiconductor self-standing substrate 10 having an arbitrary composition and a c-plane main surface; a flux mixture of a predetermined molten Group III element and a predetermined molten metal; and a nitrogen compound or nitrogen plasma as a nitrogen source. No particular limitation is imposed on, for example, the shape of a flux mixture container (crucible) or jig employed, and known crucibles and jigs having shapes as described below may be employed.

In a first example, as shown in FIG. 1A, a crucible 26-1 having a sloped flat inner wall is provided, and a GaN self-standing substrate 10 having a c-plane main surface is provided in the crucible 26-1 so that the nitrogen-face of the substrate 10 comes into close contact with the flat inner surface, and the gallium-face $F_{Ga}$ of the substrate 10 is exposed. The GaN self-standing substrate 10 is supported and immobilized on the bottom and sloped flat inner wall of the crucible 26-1 by fixation means (not illustrated). Thus, a flux mixture of molten gallium and sodium is charged into the crucible 26-1 so that the upper surface of the flux mixture reaches the level shown by a long broken line in FIG. 1A, and, under pressurized nitrogen, a GaN single crystal is deposited and grown on the gallium-face $F_{Ga}$ of the GaN self-standing substrate 10 having a c-plane main surface.

In a second example, as shown in FIG. 1B, a crucible 26-2 having a horizontally facing flat inner wall is provided, and a GaN self-standing substrate 10 having a c-plane main surface is provided in the crucible 26-2 so that the nitrogen-face of the substrate 10 comes into close contact with the flat inner surface, and the gallium-face $F_{Ga}$ of the substrate 10 is exposed. In this case, the GaN self-standing substrate 10 is fixed by means of a jig ST-2 so as not to be detached from the flat inner wall of the crucible 26-2. Then, a flux mixture of molten gallium and sodium is charged into the crucible 26-2 so that the upper surface of the flux mixture reaches the level shown by a long broken line in FIG. 1B, and, under pressurized nitrogen, a GaN single crystal is deposited and grown on the gallium-face $F_{Ga}$ of the GaN self-standing substrate 10 having a c-plane main surface.

In a third example, as shown in FIG. 1C, a crucible 26-3, which may assume any shapes (e.g., a cylindrical shape) so long as it has a flat bottom, is provided; a jig ST-3 is provided on the flat bottom of the crucible 26-3; and two GaN self-standing substrates 10-1, 10-2, each having a c-plane main surface, are provided on the jig ST-3. In this case, the two GaN self-standing substrates 10-1, 10-2 are fixed by means of the jig ST-3 so that the nitrogen-faces of the substrates 10-1, 10-2 come into close contact with each other, and the c-axis is in a horizontal direction. That is, the gallium-faces $F_{Ga}$-1 and $F_{Ga}$-2 of the two GaN self-standing substrates 10-1, 10-2 are exposed. Thus, a flux mixture of molten gallium and sodium is charged into the crucible 26-3 so that the upper surface of the flux mixture reaches the level shown by a long broken line in FIG. 1C, and, under pressurized nitrogen, a GaN single crystal is deposited and grown on the gallium-faces $F_{Ga}$-1 and $F_{Ga}$-2 of the GaN self-standing substrates 10-1, 10-2, each having a c-plane main surface.

In a fourth example, as shown in FIG. 1D, a crucible 26-4, which may assume any shapes (e.g., a cylindrical shape) so long as it has a flat bottom, is provided; a jig ST-4 is provided on the flat bottom of the crucible 26-4; and a GaN self-standing substrate 10 having a c-plane main surface is fixed on the jig ST-4. In this case, the GaN self-standing substrate 10 is fixed on the jig ST-4 so that the nitrogen-face of the substrate 10 is covered with the jig ST-4, and the c-axis is in a horizontal direction. That is, the gallium-face $F_{Ga}$ of the GaN self-standing substrate 10 is exposed. Thus, a flux mixture of molten gallium and sodium is charged into the crucible 26-4 so that the upper surface of the flux mixture reaches the level shown by a long broken line in FIG. 1D, and, under pressurized nitrogen, a GaN single crystal is deposited and grown on the gallium-face $F_{Ga}$ of the GaN self-standing substrate 10 having a c-plane main surface. In this case, preferably, the size of the jig ST-4 is slightly greater than that of the GaN self-standing substrate 10, whereby a crystal grown on a side surface of the substrate 10 is less likely to reach the nitrogen-face thereof. When the size of the jig ST-4 is excessively greater than that of the GaN self-standing substrate 10, convection of the flux mixture is more likely to be blocked.

Next will be described, for example, other conditions for carrying out the present invention.

The temperature of reaction between a Group III element and nitrogen in the flux mixture is preferably 500° C. to 1,100° C., more preferably about 850° C. to about 900° C. The pressure of a nitrogen-containing gas atmosphere is preferably 0.1 MPa to 6 MPa, more preferably about 3.5 MPa to about 4.5 MPa. When ammonia gas ($NH_3$) is employed, the pressure of the gas atmosphere may be reduced. The nitrogen-containing gas employed may be in a plasma state.

The flux mixture may contain, as an impurity added to a target Group III nitride-based compound semiconductor crystal, for example, boron (B), thallium (Tl), calcium (Ca), a calcium (Ca)-containing compound, silicon (Si), sulfur (S), selenium (Se), tellurium (Te), carbon (C), oxygen (O), aluminum (Al), indium (In), alumina ($Al_2O_3$), indium nitride (InN), silicon nitride ($Si_3N_4$), silicon oxide ($SiO_2$), indium oxide ($In_2O_3$), zinc (Zn), magnesium (Mg), strontium (Sr), barium (Ba), zinc oxide (ZnO), magnesium oxide (MgO), or germanium (Ge). These impurities may be incorporated singly or in combination of two or more species. Alternatively, such an impurity is not necessarily incorporated. That is, these impurities may be selected or combined as desired. Addition of such an impurity enables a target semiconductor crystal to exhibit predetermined characteristic values in terms of, for example, bandgap, electrical conductivity, lattice constant, and preferential growth orientation.

Before initiation of target crystal growth through the flux process, a nitride (e.g., $Ca_3N_2$, $Li_3N$, $NaN_3$, BN, $Si_3N_4$, or InN) may be incorporated in advance in the flux mixture, so as to suppress or prevent dissolution, in the flux mixture, of a seed crystal (Group III nitride-based compound semiconductor crystal), which is part of a base substrate. When such a nitride is incorporated in the flux mixture, the nitrogen concentration of the flux mixture is increased, and therefore dissolution of the seed crystal in the flux mixture before initiation of target crystal growth can be prevented or suppressed.

No particular limitation is imposed on the crystal growth apparatus employed, so long as the flux process can be carried out by means of the apparatus. For example, a crystal growth apparatus described in any of the aforementioned patent documents may be employed. When crystal growth is performed through the flux process, preferably, the temperature of a reaction chamber of the crystal growth apparatus employed can be raised or lowered to about 1,000° C. Preferably, the pressure in the reaction chamber can be increased or decreased to about 100 atm (about $1.0 \times 10^7$ Pa). The electric furnace, reaction container, raw material gas tank, piping, etc. of the crystal growth apparatus employed are preferably made of a material of high heat resistance and high pressure resistance (e.g., a stainless steel (SUS) material or an alumina material).

Similar to the aforementioned crystal growth apparatus components, a crucible employed must have high heat resistance and alkali resistance. The crucible is preferably made of a metallic or ceramic material (e.g., tantalum (Ta), tungsten (W), molybdenum (Mo), alumina, sapphire, or pyrolytic boron nitride (PBN)).

The crystal growth apparatus employed may include means for swinging the flux mixture or the seed crystal. Since the flux mixture can be stirred through such swinging means, the flux mixture may be uniformly distributed over the crystal growth surface of the seed crystal. The minimum required swinging frequency, which may vary with swinging angle, is, for example, about 10 times/min.

No particular limitation is imposed on the size or thickness of the seed crystal, but, from the viewpoint of industrial utility, the seed crystal more preferably assumes, for example, a circular shape having a diameter of about 45 mm, a square shape having a size of about 27 mm×about 27 mm, or a square shape having a size of about 13 mm×about 13 mm. Preferably, the seed crystal has a crystal growth surface with a larger curvature radius (i.e., a flatter crystal growth surface).

The line normal to the crystal growth surface of the seed crystal is preferably maintained in a horizontal direction to a maximum extent. In the case where the crucible is caused to swing, when the line normal to the crystal growth surface is maintained, on average, in a direction orthogonal to or nearly orthogonal to a swinging direction, sufficient effects are obtained.

Specific embodiments of the present invention will next be described.

However, the present invention is not limited to the below-described embodiments.

First Embodiment

Firstly, a GaN self-standing substrate 10 (diameter: 50 mm, thickness: 0.5 mm) was provided. The GaN self-standing substrate 10 could be dissolved in a flux mixture to some extent before initiation of growth of a target semiconductor crystal through the flux process. Therefore, the GaN self-standing substrate must have such a thickness that it is not completely dissolved in the flux mixture before initiation of crystal growth.

Alternatively, in order to prevent or suppress dissolution of such a seed crystal in the flux mixture, for example, a nitride (e.g., $Ca_3N_2$, $Li_3N$, $NaN_3$, BN, $Si_3N_4$, or InN) may be added in advance to the flux mixture before the below-described crystal growth treatment.

FIG. 2 shows the configuration of a crystal growth apparatus 20 employed in the present embodiment. The crystal growth apparatus 20, which is employed for carrying out crystal growth treatment through the flux process, includes an electric furnace (external container) 25 having a gas feed tube 21 for feeding nitrogen gas ($N_2$) of high temperature and high pressure, and a gas discharge tube 22 for discharging nitrogen gas. The electric furnace 25 includes therein a heater H, heat-insulating members 23, and a stainless steel container (internal container) 24. The electric furnace (external container) 25, the gas feed tube 21, the gas discharge tube 22, etc. are made of a stainless steel (SUS) material or an alumina material, in consideration of, for example, heat resistance, pressure resistance, and reactivity.

A crucible (reaction container) 26 is provided in the stainless steel container 24. The crucible 26 may be made of, for example, tungsten (W), molybdenum (Mo), boron nitride (BN), pyrolitic boron nitride (PBN), or alumina ($Al_2O_3$).

The temperature of the interior of the electric furnace 25 can be raised or lowered as desired within a range of 1,000° C. or lower. The crystal growth pressure in the stainless steel container 24 can be increased or decreased as desired within a range of $1.0 \times 10^7$ Pa or less.

Although not shown in FIG. 2, the aforementioned GaN self-standing substrate 10 was provided in the crucible (reaction container) 26 by means of the jig ST-4 shown in FIG. 1D so that the gallium-face $F_{Ga}$ of the substrate 10 was exposed. The radius of the jig ST-4 was regulated to be greater by about 2.5 mm than that of the GaN self-standing substrate 10. That is, the diameter of the jig ST-4 was regulated to be 55 mm.

Next will be described the crystal growth process of the first embodiment employing the aforementioned crystal growth apparatus.

Firstly, sodium (Na) (15 g) and gallium (Ga) (20 g) are placed in the reaction container (crucible 26) containing the GaN self-standing substrate 10, and the reaction container (crucible 26) is provided in the reaction chamber (stainless steel container 24) of the crystal growth apparatus, followed by evacuation of the gas contained in the reaction chamber.

Setting of the substrate or the raw material in the reaction container is carried out in a glove box filled with an inert gas (e.g., Ar gas), since, when such an operation is performed in air, Na is immediately oxidized. If necessary, any of the aforementioned additives (e.g., an alkaline earth metal) may be added in advance to the crucible.

Subsequently, while the temperature of the crucible is raised to about 880° C., nitrogen gas ($N_2$) is fed into the reaction chamber of the crystal growth apparatus, whereby the nitrogen gas ($N_2$) pressure in the reaction chamber is maintained at about 3.7 MPa. In this case, the aforementioned GaN self-standing substrate 10 was immersed in a melt (flux mixture) formed through the above temperature rising, and held in the crucible 26.

Preferably, throughout the crystal growth process, the gallium-face $F_{Ga}$ (i.e., crystal growth surface) is immersed in the melt (flux mixture), and the nitrogen component ($N_2$ or N) of the gas atmosphere is sufficiently incorporated into the melt by means of, for example, thermal convection due to the heating effect of the heater H. The growth rate of a target semiconductor crystal can be increased by thermal convection generated in the flux mixture.

Thereafter, while the flux mixture was stirred by continuously generating thermal convection in the flux mixture, the aforementioned crystal growth conditions were maintained for about 200 hours, to thereby continue crystal growth.

Under the above-described conditions, the elements (Ga and N) constituting the material for a Group III nitride-based compound semiconductor are continuously in a supersaturated state in the vicinity of the crystal growth surface of the seed crystal. Therefore, a target semiconductor crystal (GaN single crystal) can be successfully grown on the gallium-face $F_{Ga}$ (i.e., crystal growth surface) of the GaN self-standing substrate 10.

Subsequently, the reaction chamber of the crystal growth apparatus is cooled to the vicinity of room temperature, and the above-grown GaN single crystal (target semiconductor crystal) is removed from the reaction chamber. Thereafter, while the temperature of an atmosphere surrounding the GaN single crystal is maintained at 30° C. or lower, the flux (Na) deposited on the periphery of the single crystal is removed by use of ethanol.

When the above-described steps are sequentially carried out, a high-quality semiconductor single crystal (GaN single crystal) can be produced at low cost. The thus-grown semiconductor single crystal was found to have almost the same area as the GaN self-standing substrate 10 (i.e., seed crystal) and a c-axis thickness of about 2 mm, and to have considerably reduced cracks as compared with the case of a conventional semiconductor single crystal (FIG. 3A).

The procedure of the first embodiment was repeated, except that the size of the jig ST-4 was regulated to be equal to that of the GaN self-standing substrate 10 (i.e., seed crystal), to thereby perform crystal growth. The jig ST-4A made of sapphire was employed. After completion of crystal growth, the reaction chamber was cooled to room temperature, and the thus-grown crystal was recovered from the flux mixture. As shown in FIG. 3B, a crystal grown from side surfaces of the GaN self-standing substrate 10 reached the nitrogen-face of the seed crystal (i.e., the junction surface between the GaN self-standing substrate 10 and the jig ST-4), and entered the jig ST-4; and cracks 30 were generated partially in the thus-grown crystal. This indicates that the size of the jig ST-4 is preferably greater than that of the GaN self-standing substrate 10 (i.e., seed crystal).

OTHER MODIFICATIONS

The present invention is not limited to the above-described embodiments, and the below-exemplified modifications may be made. Effects of the present invention can also be obtained through such modifications or applications according to the operation of the present invention.

For example, in a Group III nitride-based compound semiconductor represented by the aforementioned compositional formula, which constitutes a target semiconductor crystal, at least a portion of the Group III element (Al, Ga, or In) may be substituted by, for example, boron (B) or thallium (Tl); or at least a portion of nitrogen (N) may be substituted by, for example, phosphorus (P), arsenic (As), antimony (Sb), or bismuth (Bi).

A p-type impurity (acceptor) such as an alkaline earth metal (e.g., magnesium (Mg) or calcium (Ca)) may be added to a target semiconductor crystal. Alternatively, an n-type impurity (donor) such as silicon (Si), sulfur (S), selenium (Se), tellurium (Te), or germanium (Ge) may be added to a target semiconductor crystal. Two or more impurity (acceptor or donor) elements may be added together, or both p-type and n-type impurities may be added together. Such an impurity may be added to a target semiconductor crystal by, for example, dissolving the impurity in a flux mixture in advance.

The present invention is useful for, for example, the production of a semiconductor device from a Group III nitride-based compound semiconductor crystal. Examples of such a semiconductor device include light-emitting devices (e.g., LEDs and LDs), photoreceptors, and other common semiconductor devices (e.g., FETs).

What is claimed is:

1. A method for producing a Group III nitride-based compound semiconductor crystal in which a Group III nitride-based compound semiconductor crystal is grown by reacting nitrogen (N) with a Group III element of gallium (Ga), aluminum (Al), or indium (In) in a flux mixture comprising an alkali metal, the method comprising:
   placing, in the flux mixture, a plate-form self-standing substrate comprising a Group III nitride-based compound semiconductor and comprising a +c-plane main surface, the substrate comprising a plate-form seed crystal, such that a line normal to the +c-plane of the seed crystal is maintained in a direction within ±30° with respect to a horizontal plane; and
   growing a semiconductor crystal on a Group III element-face of the seed crystal while the Group III element-face of the plate-form seed crystal is exposed to the flux mixture and a nitrogen-face of the seed crystal is substantially not exposed to the flux mixture,
   wherein the placing of the plate-form self-standing substrate comprises placing the plate-form seed crystal such that the nitrogen-face of the seed crystal comes into close contact with a wall of a flux mixture container.

2. A method for producing a Group III nitride-based compound semiconductor crystal in which a Group III nitride-based compound semiconductor crystal is grown by reacting nitrogen (N) with a Group III element of gallium (Ga), aluminum (Al), or indium (In) in a flux mixture comprising an alkali metal, the method comprising:
   placing, in the flux mixture, a plate-form self-standing substrate comprising a Group III nitride-based compound semiconductor and comprising a +c-plane main surface, the substrate serving as a seed crystal, such that a line normal to the +c-plane of the seed crystal is maintained in a direction within ±30° with respect to a horizontal plane; and
   growing a semiconductor crystal on a Group III element-face of the seed crystal while the Group III element-face of a plate-foam seed crystal is exposed to the flux mixture and a nitrogen-face of the seed crystal is substantially not exposed to the flux mixture,
   wherein a pair of plate-form seed crystals is placed in the flux mixture container such that nitrogen-faces of the seed crystals come into close contact with each other.

3. A method for producing a Group III nitride-based compound semiconductor crystal in which a Group III nitride-based compound semiconductor crystal is grown by reacting nitrogen (N) with a Group III element of gallium (Ga), aluminum (Al), or indium (In) in a flux mixture comprising an alkali metal, the method comprising:
   placing, in the flux mixture, a plate-form self-standing substrate comprising a Group III nitride-based compound semiconductor and comprising a +c-plane main surface, the substrate serving as a seed crystal, such that a line normal to the +c-plane of the seed crystal is maintained in a direction within ±30° with respect to a horizontal plane; and
   growing a semiconductor crystal on a Group III element-face of the seed crystal while the Group III element-face of a plate-form seed crystal is exposed to the flux mixture and a nitrogen-face of the seed crystal is substantially not exposed to the flux mixture,
   wherein the nitrogen-face of the plate-form seed crystal is covered with a member comprising a material other than a Group III nitride-based compound semiconductor, and then the seed crystal is placed in the flux mixture container.

4. A production method as described in claim 3, wherein the member has a size greater than that of the plate-form seed crystal.

5. A production method as described in claim 3, wherein the member comprises a surface on which a Group III nitride-based compound semiconductor crystal is not grown during an exposure of the member to the flux mixture.

6. A production method as described in claim 4, wherein the member comprises a surface on which a Group III nitride-based compound semiconductor crystal is not grown during exposure of the member to the flux mixture.

7. A production method as described in claim 1, wherein a pair of plate-form seed crystals is placed in the flux mixture container.

8. A production method as described in claim 1, wherein the nitrogen-face of the plate-form seed crystal is covered with a member comprising a material other than a Group III nitride-based compound semiconductor.

9. A production method as described in claim 8, wherein the member has a size greater than a size of the plate-form seed crystal.

10. A production method as described in claim 8, wherein the member comprises a surface on which a Group III nitride-based compound semiconductor crystal is devoid of growing during an exposure of the member to the flux mixture.

11. A production method as described in claim 1, wherein the seed crystal is placed in the flux mixture container after the nitrogen-face of the plate-form seed crystal is covered with a member.

* * * * *